US008872338B2

(12) United States Patent
Young

(10) Patent No.: US 8,872,338 B2
(45) Date of Patent: Oct. 28, 2014

(54) TRACE ROUTING WITHIN A SEMICONDUCTOR PACKAGE SUBSTRATE

(71) Applicant: Brian D. Young, Austin, TX (US)

(72) Inventor: Brian D. Young, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/675,008

(22) Filed: Nov. 13, 2012

(65) Prior Publication Data

US 2014/0131866 A1 May 15, 2014

(51) Int. Cl.
*H01L 23/48* (2006.01)
*H01L 21/768* (2006.01)

(52) U.S. Cl.
CPC ........ *H01L 23/481* (2013.01); *H01L 21/76898* (2013.01)
USPC ............... 257/738; 257/E39.007; 257/737; 257/778; 257/773; 257/774; 257/21; 257/202; 257/208; 257/204; 257/759; 257/642; 257/702; 257/643; 257/791

(58) Field of Classification Search
USPC ......... 257/737, 738, 778, 773, 774, 211, 202, 257/208, 642, 702, 643, 791, E39.007, 204, 257/759
See application file for complete search history.

(56) References Cited

U.S. PATENT DOCUMENTS

| 4,614,922 | A |  | 9/1986 | Bauman et al. |
| 4,675,625 | A |  | 6/1987 | Johnston |
| 4,942,373 | A |  | 7/1990 | Ozawa et al. |
| 5,030,931 | A |  | 7/1991 | Brooks et al. |
| 6,524,926 | B1 | * | 2/2003 | Allman et al. ................ 438/387 |
| 6,934,926 | B1 |  | 8/2005 | Bogusch |
| 6,963,136 | B2 | * | 11/2005 | Shinozaki et al. ............ 257/759 |
| 8,114,712 | B1 | * | 2/2012 | McConnelee et al. ........ 438/118 |
| 8,368,185 | B2 | * | 2/2013 | Lee et al. ...................... 257/659 |
| 2008/0138575 | A1 | * | 6/2008 | Yang ............................. 428/137 |
| 2009/0206447 | A1 | * | 8/2009 | Basker et al. ................. 257/530 |
| 2011/0100700 | A1 | * | 5/2011 | Kariya et al. ................. 174/267 |

(Continued)

FOREIGN PATENT DOCUMENTS

GB     1185059 A     3/1970

OTHER PUBLICATIONS

J. Hu and R. Hu, "9.5 GHz 16 lamda_delay line using multilayer LTCC," Progress in Electromagnetics Research Letters, vol. 6, 175-182, 2009.

(Continued)

*Primary Examiner* — Alexander Oscar Williams
(74) *Attorney, Agent, or Firm* — Joanna G. Chiu; Mary Jo Bertani

(57) ABSTRACT

A semiconductor device includes a substrate configured with a plurality of conductive traces. The traces are configured to electrically couple to an integrated circuit (IC) die and at least one of the plurality of conductive traces includes first electrically conductive portions in a first electrically conductive layer of the substrate, second electrically conductive portions in a second electrically conductive layer of the substrate, and first electrically conductive connections between the first electrically conductive portions and the second electrically conductive portions. The first and second electrically conductive portions and the first electrically conductive connections form a continuous path along at least a portion of the at least one of the conductive traces. Time delay of conducting a signal along the at least one of the conductive traces is within a specified amount of time of time delay of conducting a signal along another one of the plurality of conductive traces.

19 Claims, 2 Drawing Sheets

(56) References Cited

U.S. PATENT DOCUMENTS

2011/0115059 A1* 5/2011 Lee et al. .................. 257/659
2012/0032755 A1   2/2012 Shiue et al.
2013/0189935 A1* 7/2013 Nair et al. ................ 455/90.2
2013/0256875 A1* 10/2013 Chen et al. ................ 257/737

OTHER PUBLICATIONS

Kim, G. et al., "3D Strip Meander Delay Line Structure for Multilayer LTCC-based SiP Applications", 2008 Electronic Components and Technology Conference, pp. 2081-2085.

* cited by examiner

TRACE ROUTING WITHIN A SEMICONDUCTOR PACKAGE SUBSTRATE

BACKGROUND

1. Field

This disclosure relates generally to semiconductor processing and more specifically, to trace routing within a semiconductor package substrate.

2. Related Art

Within semiconductor packages, metal traces are used in the package substrate to communicate signals between the semiconductor die and the circuitry external to the semiconductor package, such as to a printed circuit board (PCB). Typically, it is desirable to match the delay of these metal traces with each other in order to increase the timing margin of the interface between two semiconductor devices (such as two semiconductor devices connected to a PCB). Extra delay can be achieved by implementing longer trace routing that is compacted in length by lateral zig-zag routing within a single metal layer, which is typically referred to as "serpentine" or "meandering" routing. However, this type of lateral routing requires greater area within the single metal layer, which may not be available. For example, the lateral routing may block needing routing room of other traces.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Within a packaged semiconductor device, metal traces within the package substrate are used to route signals from the semiconductor die mounted onto the package substrate to an external interface of the packaged device. One type of packaged semiconductor device is a flip chip device which may be used, for example, for high speed applications. In a flip chip configuration, a semiconductor die can be mounted with bumps onto a package substrate which may include a plurality of solder balls for connection to other circuitry, such as by way of a PCB. In this configuration, metal traces within the package substrate route signals from the solder bumps to the solder balls. Within semiconductor package substrates, and within connections between packaged semiconductor devices (such as within a PCB), it is desirable to match the time delay of metal traces to increase timing margin. Furthermore, this may be more desirable in higher speed applications. In one embodiment, in order to increase the delay of a metal trace in a semiconductor package substrate, a vertical routing which occurs in multiple metal layers is used in which a metal trace uses vias to continuously alternate between at least two metal layers. In this manner, delay of the metal trace may be increased by routing without requiring too much additional lateral routing spacing within a single metal layer. In one embodiment, a metal trace within a package substrate includes a plurality of metal portions in a first metal layer and a plurality of metal portions in a second metal layer, connected to each other by conductive vias to form a continuous path, in which the plurality of metal portions and the conductive vias all overlap a same vertical plane with respect to the top and bottom major surfaces of the package substrate.

Figure 1:
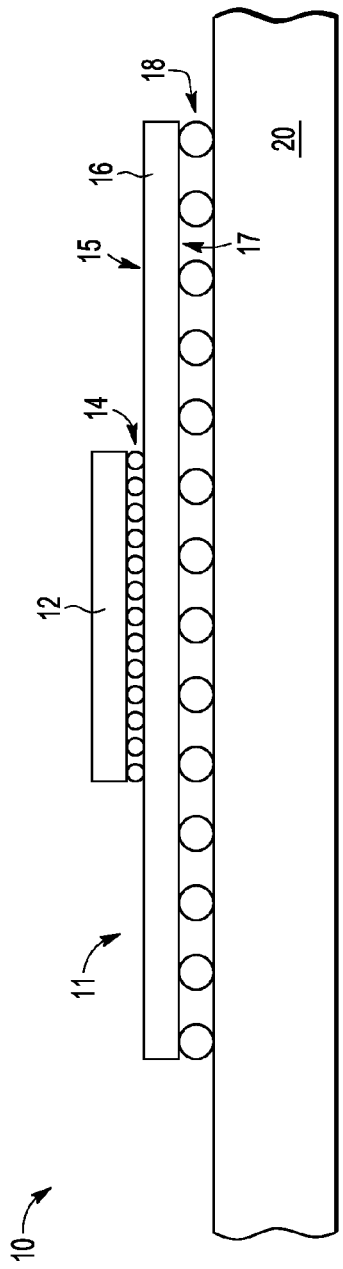
FIG. 1 illustrates a cross section of a semiconductor device assembly in accordance with an embodiment of the present disclosure.

FIG. 1 illustrates, in cross-sectional form, a packaged semiconductor device assembly 10 in accordance with an embodiment of the present disclosure. Assembly 10 illustrates a packaged semiconductor device 11 mounted onto a PCB 20. Packaged semiconductor device 11 includes a semiconductor die 12 (also referred to as an integrated circuit die) mounted onto a package substrate 16. In the illustrated embodiment, packaged semiconductor device 11 is in a flip chip configuration, such that semiconductor die 12 includes a plurality of conductive bumps 14 which are used to mount die 12 onto a top major surface 15 of package substrate 16. Package substrate 16 also includes a plurality conductive balls 18 on a bottom major surface 17 of package substrate 16 which may be used to connect packaged semiconductor device 11 to other circuitry. In the illustrated embodiment, balls 18 are connected to PCB 20 which may include other devices coupled thereto. Therefore, in the illustrated embodiment, metal traces are used to route electrical signals from die 12 (by way of bumps 14) through package substrate 16 to balls 18. That is, the metal traces are electrically connected to die 12 and to balls 18. Balls 18 provides an external signal interface of packaged semiconductor device 11. In the illustrated embodiment, packaged semiconductor device 11 is connected to PCB 20, in which PCB 20 may also include other electrical devices. Therefore, PCB 20 may also include metal traces which route electrical signals from packaged semiconductor device 11 (by way of balls 18) to other devices. Therefore, note that, semiconductor die 12 is coupled to packaged substrate 16 and to PCB 20.

Figure 2:
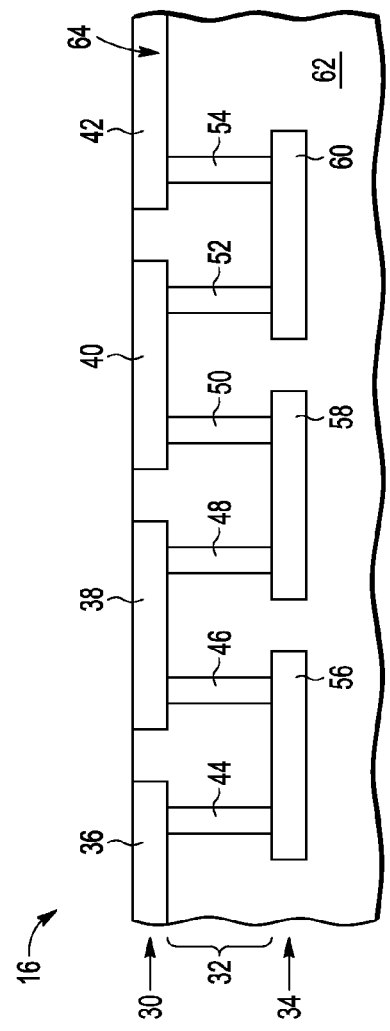
FIG. 2 illustrates a cross section of a portion of the package substrate of FIG. 1 in accordance with an embodiment of the present disclosure.

FIG. 2 illustrates, in cross-sectional form, a portion of package substrate 16 in accordance with an embodiment of the present disclosure. Substrate 16 includes a first metal layer 30, a via layer 32, and a second metal layer 34. In the illustrated embodiment, second metal layer 34 is an immediately adjacent metal layer to first metal layer 30. Also, first and second metal layers 30 and 34 can be any two adjacent metal layers within substrate 16. Substrate 16 also includes a metal trace 64. Metal trace 64 includes metal portions 36, 38, 40, and 42 within metal layer 30, conductive vias 44, 46, 48, 50, 52, and 54 within via layer 32, and metal portions 56, 58, and 60 within metal layer 34. Therefore, note that metal trace 64 is a continuous metal trace within metal portions in two different metal layers which are connected to each other by way of conductive vias. In this manner, metal trace 64 has a greater time delay for conducting a signal as compared to what its time delay would be if it were located linearly in only metal layer 30. Substrate 16 also includes dielectric material 62 in which metal trace 64 is formed. In the illustrated embodiment, and as will be further described in reference to FIG. 4, metal portions 36, 38, 40, 56, 58, and 60 and vias 44, 46, 48, 50, 52, and 54 are positioned in a single vertical plane with respect to top major surface 15 and bottom major surface 17. That is, the single vertical plane is perpendicular to the plane which contains top major surface 15 and to the plane which contains bottom major surface 17. Therefore, note that metal portions 36, 38, 40, 56, 58, and 60 and vias 44, 46, 48, 50, 52, and 54 are coplanar between metal layers 30 and 34.

Figure 3:
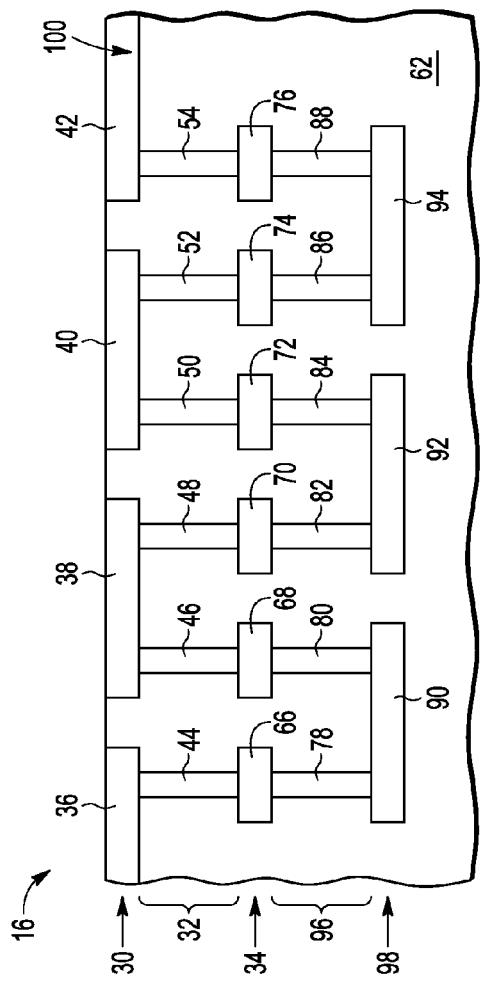
FIG. 3 illustrates a cross section of a portion of the package substrate of FIG. 1 in accordance with an embodiment of the present disclosure.

FIG. 3 illustrates, in cross-sectional form, a portion of package substrate 16 in accordance with another embodiment of the present disclosure, in which like numerals indicate like elements. As illustrated in FIG. 3, substrate 16 further includes a second via layer 96 below metal layer 34 and a third metal layer 98 below via layer 96. In the illustrated embodiment, third metal layer 98 is an immediately adjacent metal layer to second metal layer 34. Also, first, second, and third metal layers 30, 34 and 98 can be any three adjacent metal layers within substrate 16. Substrate 16 also includes a metal trace 100. Metal trace 100 includes metal portions 36, 38, 40, and 42 within metal layer 30, conductive vias 44, 46, 48, 50, 52, and 54 within via layer 32, metal portions 66, 68, 70, 72, 74, and 76 within metal layer 34, conductive vias 78, 80, 82, 84, 86, and 88 within via layer 96, and metal portions 90, 92, and 94 within metal layer 98. Therefore, note that metal trace 100 is a continuous metal trace within metal portions in three different metal layers which are connected to each other by way of conductive vias. In this manner, metal trace 100 has a greater time delay to conduct a signal as compared to what its time delay would be if it were located linearly in only metal layer 30. As with metal trace 64, metal trace 100 is formed within dielectric material 62. In the illustrated embodiment, and as will be further described in reference to FIG. 4, metal portions 36, 38, 40, 42, 66, 68, 70, 72, 74, 76, 90, 92, and 94 and vias 44, 46, 48, 50, 52, 54, 78, 80, 82, 84, 86, and 88 are positioned in a single vertical plane with respect to top major surface 15 and bottom major surface 17. That is, the single vertical plane is perpendicular to the plane which contains top major surface 15 and to the plane which contains bottom major surface 17. Therefore, note that metal portions 36, 38, 40, 42, 66, 68, 70, 72, 74, 76, 90, 92, and 94 and vias 44, 46, 48, 50, 52, 54, 78, 80, 82, 84, 86, and 88 are coplanar between metal layers 30 and 98. In the illustrated embodiment, vias 44, 46, 48, 50, 52, and 54 are stacked vertically in an aligned manner with vias 78, 80, 82, 84, 86, and 88, respectively. However, in alternate embodiments, the vias of the two different via layers (e.g. via layers 32 and 96) need not be vertically stacked. That is, they may be shifted from each other, but still located in the same single vertical plane as the metal portions of metal trace 100.

Note that each metal portion of trace 64 or 100 may be referred to as an electrically conductive portion and the conductive vias of trace 64 or 100 may be referred to as an electrically conductive connection or trace. Also, each of the metal layers, such as metal layers 30 and 34, may be referred to as electrically conductive layers of substrate 16. Each of the metal portions and conductive vias may be formed of a metal or other conductive material, in which a same metal or conductive material can be used along each trace or different metals or conductive materials can be used within each trace.

Figure 4:
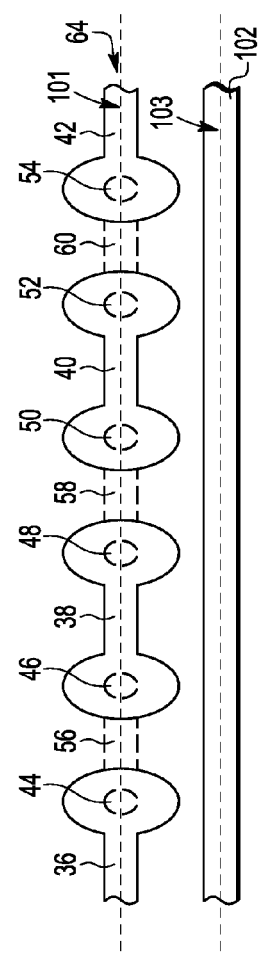
FIG. 4 illustrates a top down view of the metal trace of FIG. 2.

FIG. 4 illustrates a top down view of trace 64 in metal layer 30 of FIG. 2. Note that each metal portion 36, 38, 40, and 42 of trace 64 which is in metal layer 30 includes a larger area at the ends in order to accommodate the vias which connect to underlying metal layer 34. Each of the larger ends in FIG. 5 includes a dotted circle which represents the corresponding via in via layer 32 which is located under the metal portions. For example, the illustrated larger end of metal portion 36 includes a dotted circle representative of conductive via 44 located under metal portion 36. Also, between each metal portion in metal layer 30, dotted lines are used to indicate the metal portions of trace 64 which are located in underlying metal layer 34. For example, between metal portions 36 and 38 is metal portion 56 located in metal layer 34 and connected to each of metal portions 36 and 38 by way of conductive vias 44 and 46, respectively. Also illustrated in FIG. 4 is a dotted line indicating a single vertical plane 101 that is vertical with respect to top major surface 15 and bottom major surface 17 of package substrate 16. Therefore, note that each of metal portions 36, 38, 40, 42, 56, 58, and 60, as well as vias 44, 46, 48, 50, 52, and 54 are all located in vertical plane 101. That is, each of metal portions 36, 38, 40, 42, 56, 58, and 60, as well as vias 44, 46, 48, 50, 52, and 54 all intersect or overlap vertical plane 101. Furthermore, in one embodiment, a center major axis of the portion of trace 64 illustrated in FIG. 4, which extends through all of metal portions 36, 38, 40, 42, 56, 58, and 60, is located within vertical plane 101.

Note that the top down view of trace 64 and its descriptions would also apply to trace 100. That is, the top down view of trace 64 in metal layer 30 is the same as the top down view of trace 100 in metal layer 30. Furthermore, the metal portions in metal layer 30 would include the larger ends to accommodate the vias in the underlying via layer. Therefore, the descriptions being provided for the vertical routing of trace 64 also apply to the vertical routing of trace 100. Also, note that traces similar to traces 64 and 100 can be present in PCB 20.

Also illustrated in FIG. 4 is an adjacent metal trace 102 which runs substantially parallel to metal trace 64 in metal layer 30. In one embodiment, the dotted line through trace 102 represents a vertical plane with respect to top major surface 15 and bottom major surface 17 of package substrate 16 in which trace 102 is located. In one embodiment, vertical plane 103 is substantially parallel to vertical plane 101, at least along a portion of traces 64 and 102. In one embodiment, trace 102 is within a predetermined distance of trace 64 (or 100), at least along a portion of traces 64 and 102. Note that some additional lateral space within metal layer 30 is needed to accommodate the larger ends of metal portions 36, 38, 40, and 42 of metal trace 64 (or of metal trace 100) to allow metal trace 64 (or metal trace 100) to route vertically between different metal layers. However, this additional lateral space is minimal as compared to the lateral space required within metal layer 30 to allow for lateral "serpentine" or "meandering" routing. In this manner, a time delay of a metal trace may be increased in order to have a resulting time delay (such as the resulting delay of either trace 64 or 100) that is within a specified amount of time delay of another trace (such as trace 102) while requiring only a small amount of additional lateral space within metal layer 30.

Figure 5:
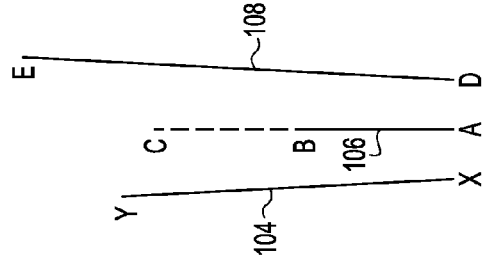
FIG. 5 illustrates, in diagrammatic form, example metal traces of a semiconductor package substrate in accordance with an embodiment of the present disclosure.

FIG. 5 illustrates, in diagrammatic form, various example metal traces of a substrate (which may refer to package substrate 16 or PCB 20) in accordance with an embodiment. FIG. 5 includes the visible portions of metal traces 104, 106, and 108 within a same metal layer, such as within metal layer 30. Therefore, the portions of traces 104 (between points X and Y) and 108 (between points D and E) illustrated in FIG. 5 are all located within the same metal layer. Furthermore, metal trace 106 is also a continuous metal trace, but only portions (between points A and B, and the dotted portions between points B and C) are located within the same metal layer as traces 104 and 108. The white spaces between the dotted portions of segment B to C of trace 106 are located in a different metal layer (such as metal layer 34 or 96, or in combinations thereof). In this manner, the time delay of trace 106 to conduct a signal is now able to match the time delay of trace 108 to conduct a signal (within a predetermined tolerance). Furthermore, the delay is matched without requiring too much lateral space between traces 104 and 108, thus allowing for the compact routing to be maintained. That is, by allowing for a vertical routing between points B and C of trace 106 rather than requiring a lateral "serpentine" or "meandering" routing, a higher level of routing compactness may be maintained while still allowing for delay matching to be achieved.

Therefore, by now it should be appreciated that there has been provided a type of vertical routing which allows for delay matching without loss of large amounts of lateral routing space. For example, a particular trace may be routed to one or more different metal layers and back to the original metal layer in order to increase delay. In this manner, performance may be improved with delay matching of traces within a package substrate without blocking other routing paths. In this manner, improved performance may be achieved for high speed applications, such as those for which a flip chip packaging configuration is typically used.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, a metal trace can be vertically routed to more than one different metal layer. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a semiconductor device including a substrate; an integrated circuit (IC) die coupled to the substrate; and a plurality of metal traces in the substrate, wherein at least one of the metal traces includes a plurality of first metal portions in a first metal layer, a plurality of second metal portions in a second metal layer, a plurality of first vias connecting the first metal portions to the second metal portions so that the at least one metal trace is continuous along a length of the at least one metal trace, and the first metal portions, the second metal portions, and the first vias are positioned in a single vertical plane with respect to a top major surface and a bottom major surface of the substrate. Item 2 includes the device of item 1, wherein routing delay of the at least one metal trace matches routing delay of another one of the plurality of metal traces within a specified tolerance. Item 3 includes the device of item 1, and further includes conductive bumps on a bottom major surface of the IC die that attach to the substrate. Item 4 includes the device of item 1, and further includes solder balls on a bottom major surface of the substrate. Item 5 includes the device of item 4, and further includes a printed circuit board, wherein the solder balls attach the substrate to the printed circuit board. Item 6 includes the device of item 1, wherein the at least one of the metal traces is routed within a predetermined distance of at least another one of the metal traces. Item 7 includes the device of item 1, and further includes: the at least one of the metal traces includes: a plurality of third metal portions in a third metal layer; and a plurality of second vias connecting the second metal portions to the third metal portions so that the at least one metal trace is continuous along a length of the at least one metal trace, and the first, second and third metal portions and the first and second vias are positioned in the single vertical plane with respect to the top major surface and the bottom major surface of the substrate. Item 8 includes the device of item 1, wherein the substrate is a printed circuit board. Item 9 includes the device of item 1, wherein the IC die is a flip chip.

Item 10 includes a method which includes forming a plurality of conductive traces in a substrate, the substrate is adapted to couple to an integrated circuit (IC) die, at least one of the conductive traces is formed by: forming a first set of metal portions in a first metal layer; forming a second set of metal portions in a second metal layer; and forming first connections between the first set of metal portions and the second set of metal portions so that the at least one of the conductive traces is continuous along a length of the at least one of the conductive traces across a portion of the substrate, wherein a first time delay of conducting a signal through the at least one of the conductive traces matches a second time delay of conducting a signal through at least one of the other conductive traces within a predetermined amount of time. Item 11 includes the method of item 10, forming the first connections includes forming first vias. Item 12 includes the method of item 10, and further includes forming a third set of metal portions in a third metal layer; and forming second connections between the second set of metal portions and the third set of metal portions. Item 13 includes the method of item 10, wherein the substrate is a package substrate. Item 14 includes the method of item 10, wherein the substrate is a printed circuit board. Item 15 includes the method of item 10, wherein the IC die is a flip chip.

Item 16 includes a semiconductor device including a substrate configured with a plurality of conductive traces, wherein the conductive traces are configured to electrically couple to an integrated circuit (IC) die and at least one of the plurality of conductive traces includes: first electrically conductive portions in a first electrically conductive layer of the substrate; second electrically conductive portions in a second electrically conductive layer of the substrate; and first electrically conductive connections between the first electrically conductive portions and the second electrically conductive portions, the first and second electrically conductive portions and the first electrically conductive connections form a continuous path along at least a portion of the at least one of the conductive traces, wherein time delay of conducting a signal along the at least one of the conductive traces is within a specified amount of time of time delay of conducting a signal along another one of the plurality of conductive traces. Item 17 includes the device of item 16, wherein the first electrically conductive portions, the second electrically conductive portions, and the first electrically conductive connections are co-planar between the first and second conductive layers. Item 18 includes the device of item 16, wherein the first electrically conductive connections are vias. Item 19 includes the device of item 16, and further includes third electrically conductive portions in a third electrically conductive layer of the substrate; and second electrically conductive connections between the second electrically conductive portions and the third electrically conductive portions, the first, second and third electrically conductive portions and the first and second electrically conductive connections form the continuous path along at least the portion of the at least one of the conductive traces. Item 20 includes the device of item 16, wherein the substrate is one of a group consisting of a package substrate and a printed circuit board.

What is claimed is:

1. A semiconductor device comprising:
   a substrate;
   an integrated circuit (IC) die coupled to the substrate; and
   a plurality of metal traces in the substrate, wherein at least one of the metal traces includes
      a plurality of first metal portions in a first metal layer,
      a plurality of second metal portions in a second metal layer,
      a plurality of first vias connecting the first metal portions to the second metal portions so that the at least one metal trace is continuous along a length of the at least one metal trace, and the first metal portions, the second metal portions, and the first vias are positioned in a single vertical plane with respect to a top major surface and a bottom major surface of the substrate, wherein the routing delay of the at least one metal trace matches routing delay of another one of the plurality of metal traces within a specified tolerance.

2. The device of claim 1 further comprising:
   conductive bumps on a bottom major surface of the IC die that attach to the substrate.

3. The device of claim 1 further comprising:
   solder balls on a bottom major surface of the substrate.

4. The device of claim 3 further comprising:
   a printed circuit board, wherein the solder balls attach the substrate to the printed circuit board.

5. The device of claim 1 wherein the at least one of the metal traces is routed within a predetermined distance of at least another one of the metal traces.

6. The device of claim 1 further comprising:
   the at least one of the metal traces includes:
      a plurality of third metal portions in a third metal layer; and
      a plurality of second vias connecting the second metal portions to the third metal portions so that the at least one metal trace is continuous along a length of the at least one metal trace, and the first, second and third metal portions and the first and second vias are positioned in the single vertical plane with respect to the top major surface and the bottom major surface of the substrate.

7. The device of claim 1 wherein the substrate is a printed circuit board.

8. The device of claim 1 wherein the IC die is a flip chip.

9. A method comprising:
   forming a plurality of conductive traces in a substrate, the substrate is adapted to couple to an integrated circuit (IC) die, at least one of the conductive traces is formed by:
      forming a first set of metal portions in a first metal layer;
      forming a second set of metal portions in a second metal layer; and
      forming a plurality of first connections between the first set of metal portions and the second set of metal portions so that the at least one of the conductive traces is continuous along a length of the at least one of the conductive traces across a portion of the substrate, wherein a first time delay of conducting a signal through the at least one of the conductive traces matches a second time delay of conducting a signal through at least one of the other conductive traces within a predetermined amount of time, wherein the first set of metal portions, the second set of metal portions, and the plurality of first connections are positioned in a single vertical plane with respect to a top major surface and a bottom major surface of the substrate.

10. The method of claim 9 wherein:
    forming the first connections includes forming first vias.

11. The method of claim 9 further comprising:
    forming a third set of metal portions in a third metal layer; and
    forming second connections between the second set of metal portions and the third set of metal portions.

12. The method of claim 9, wherein the substrate is a package substrate.

13. The method of claim 9 wherein the substrate is a printed circuit board.

14. The method of claim 9 wherein the IC die is a flip chip.

15. A semiconductor device comprising:
    a substrate configured with a plurality of conductive traces, wherein the conductive traces are configured to electrically couple to an integrated circuit (IC) die and at least one of the plurality of conductive traces includes:
       first electrically conductive portions in a first electrically conductive layer of the substrate;
       second electrically conductive portions in a second electrically conductive layer of the substrate; and
       a plurality of first electrically conductive connections between the first electrically conductive portions and the second electrically conductive portions, the first and second electrically conductive portions and the first electrically conductive connections form a continuous path along at least a portion of the at least one of the conductive traces, wherein time delay of conducting a signal along the at least one of the conductive traces is within a specified amount of time of time delay of conducting a signal along another one of the plurality of conductive traces, wherein the first set of metal portions, the second set of metal portions, and the plurality of first connections are positioned in a single vertical plane with respect to a top major surface and a bottom major surface of the substrate.

16. The device of claim 15 wherein the first electrically conductive portions, the second electrically conductive portions, and the first electrically conductive connections are co-planar between the first and second conductive layers.

17. The device of claim 15 wherein the first electrically conductive connections are vias.

18. The device of claim 15 further comprising:
third electrically conductive portions in a third electrically conductive layer of the substrate; and
second electrically conductive connections between the second electrically conductive portions and the third electrically conductive portions, the first, second and third electrically conductive portions and the first and second electrically conductive connections form the continuous path along at least the portion of the at least one of the conductive traces.

19. The device of claim 15 wherein the substrate is one of a group consisting of a package substrate and a printed circuit board.

* * * * *